United States Patent
Watkins et al.

(10) Patent No.: US 6,492,814 B1
(45) Date of Patent: Dec. 10, 2002

(54) SELF LOCALIZING RECEIVE COILS FOR MR

(75) Inventors: Ronald Dean Watkins, Niskayuna, NY (US); Charles Lucian Dumoulin, Ballston Lake, NY (US); Robert David Darrow, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/683,404

(22) Filed: Dec. 21, 2001

(51) Int. Cl.[7] .................................................. G01V 3/00
(52) U.S. Cl. ........................ 324/318; 324/322; 600/421
(58) Field of Search .................................. 324/318, 322, 324/300, 306, 307, 309, 312, 314; 600/421, 422, 424

(56) References Cited

U.S. PATENT DOCUMENTS

| | | | |
|---|---|---|---|
| 4,825,162 A | 4/1989 | Roemer et al. | 324/318 |
| 5,211,165 A | 5/1993 | Dumoulin et al. | 128/653.2 |
| 5,255,680 A | 10/1993 | Darrow et al. | 128/653.2 |
| 5,307,808 A | 5/1994 | Dumoulin et al. | 128/653.2 |
| 5,353,795 A | 10/1994 | Souza et al. | 128/653.2 |
| 5,437,277 A | 8/1995 | Dumoulin et al. | 128/653.1 |
| 5,594,339 A * | 1/1997 | Henderson et al. | 324/318 |
| 5,715,822 A * | 2/1998 | Watkins et al. | 128/899 |
| 5,905,378 A | 5/1999 | Giaquinto et al. | 324/318 |
| 5,910,728 A | 6/1999 | Sodickson | 324/309 |
| 5,947,900 A * | 9/1999 | Derbyshire et al. | 324/309 |
| 6,084,411 A | 7/2000 | Giaquinto et al. | 324/318 |
| 6,289,233 B1 | 9/2001 | Dumoulin et al. | 600/410 |

OTHER PUBLICATIONS

Klaas P. Pruessmann, Markus Weiger, Markus B. Scheidegger, and Peter Boesiger, "SENSE: Sensitivity Encoding for Fast MRI", Magnetic Resonance in Medicine 42:952–962 (1999).

* cited by examiner

Primary Examiner—Louis Arana
(74) Attorney, Agent, or Firm—Jean K. Testa; Jill M. Breedlove

(57) ABSTRACT

A self-localizing receive coil system for use with a Magnetic Resonance Imaging (MRI) system comprises at least one surface coil assembly for placement adjacent to a region of interest to be imaged and a plurality of tracking devices attached to the surface coil assembly for use in indicating location and orientation of the surface coil assembly during imaging.

12 Claims, 3 Drawing Sheets

SELF LOCALIZING RECEIVE COILS FOR MR

BACKGROUND OF INVENTION

This invention relates to Magnetic Resonance Imaging (MRI) and more particularly to receive coils for MRI.

Optimal image quality in Magnetic Resonance Imaging is frequently obtained through the combined use of a large transmit coil and a smaller receive-only surface coil. The large transmit coil provides a relatively uniform excitation field whereas the smaller receive coil provides an optimal Signal-to-Noise Ratio (SNR) over the volume of interest. One important variation of this idea is the use of phased-array receive coils to provide the SNR of a smaller coil, but with the coverage of the entire array.

Recently, new techniques have been developed in which phased-array coils are used to provide partial spatial information for image reconstruction in order to reduce the scan time. These techniques known as SMASH (SiMultaneous Acquisition of Spatial Harmonics) and SENSE (Sensitivity Encoding) require that the location of the individual coils are known and characterized prior to use. Consequently, the placement of the coils is restricted to predetermined locations. Additionally, placement of the coils generally requires operator intervention subject to human error to register or locate the coils within the MRI system prior to image acquisition.

Surface coils and phased-array surface coils have several additional aspects that can be problematic in MR imaging. For example, surface coils have a very non-uniform sensitivity profile and images obtained with such coils typically have severe shading artifacts. This problem becomes increasingly severe as the coil becomes smaller.

Another aspect of surface coils is that they can be placed anywhere on the patient. For example, flexible phased array coils (also known as FLAP coils) can be wrapped around the patient before the patient is introduced into the magnet. While this aspect of surface coils is typically viewed as beneficial, if the coils are not properly placed with respect to both the patient's anatomy and the imaging volume of the MRI system, aliasing of image data can occur. This aliasing occurs when a large transmit coil has a spatial coverage that encompasses a portion of the patient beyond the nominal region of gradient linearity.

Because the magnetic field gradient is created by a physical gradient coil, the gradient cannot have an infinite extent. Thus, at some distance from the center of the gradient coil along the axis of the applied field gradient, the gradient coil makes no contribution to the local magnetic field. Consequently, in some region between the electromagnetic end and the point of maximum field change within the gradient coil, the magnetic field created by the magnet is identical to the magnetic field at some point within the active volume of the gradient coil. Thus, aliasing of image information becomes possible. This form of aliasing (hereinafter referred to as "large field of view (FOV) aliasing") occurs in the intersection of the following regions:

a) Within the excitation volume of a large transmit (i.e. Body) coil;
b) Beyond the turn-around points of the magnetic field gradient;
c) Within the homogeneous field region of the magnet;
d) Within the sensitive volume of the receive coil; and,
e) Within a region having an active MR signal source.

An MRI system which takes full advantage of the benefits afforded surface coils and surface coil arrays, while overcoming the undesirable effects of coil placement restrictions, MR signal shading and large FOV signal aliasing is needed.

SUMMARY OF INVENTION

A self-localizing receive coil system for use with a Magnetic Resonance Imaging (MRI) system comprises at least one surface coil assembly for placement adjacent to a region of interest to be imaged and a plurality of tracking devices attached to the surface coil assembly for use in indicating location and orientation of the surface coil assembly during imaging.

BRIEF DESCRIPTION OF DRAWINGS

The features and advantages of the present invention will become apparent from the following detailed description of the invention when read with the accompanying drawings in which.

DETAILED DESCRIPTION

In order to overcome the limitations of surface coils in MR imaging, the invention described here incorporates self-localizing units in each surface coil. In an embodiment of the present invention, a self-localizing surface coil system comprises a surface coil and a tracking coil. The surface coil, the tracking unit and their ancillary hardware and software comprise a surface coil localizing system that can be based upon MR tracking technology, electromagnetic tracking technology, optical location methods or the like. For the purposes of illustration, MR tracking technology will be used in the remainder of this disclosure, but one skilled in the art would appreciate that the methods and systems disclosed would be applicable to other localization methods.

Figure 1:
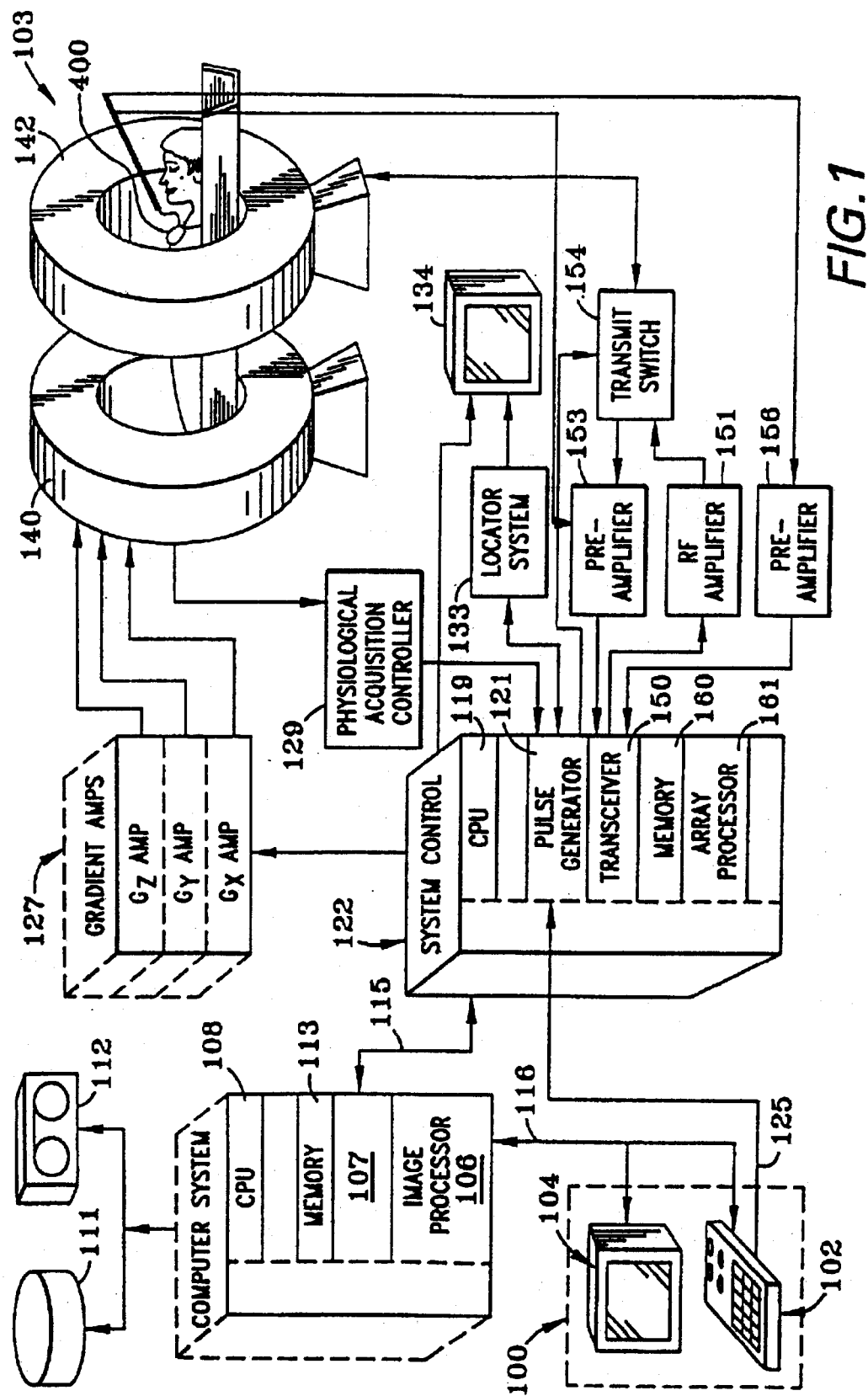
FIG. 1 is a block diagram of an MRI system which employs the present invention.

Referring first to FIG. 1, there are shown the major components of a preferred MRI system that incorporates embodiments of the present invention. The operation of the system is controlled from an operator console 100. Console 100 includes a keyboard and control panel 102 and a display 104. A separate display (not shown) can be located near the magnet system 103 so that system controls are available to a physician attending the subject of a MRI scan. The console 100 communicates through a link 116 with a separate computer system 107 that enables an operator to control the production and display of images on the screen 104. The computer system 107 includes a number of modules that communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 that connects to the operator console 100 through a serial link 125. It is through this link 125 that the system control 122 receives commands from the operator to indicate the scan sequence that is to be performed. The pulse generator module 121 operates the system components to carry out the desired scan sequence. It produces data that indicates the timing, strength and shape of the RF pulses to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a locator sub-system 133. Locator sub-system 133 is adapted to compute the location of a device within the field of view (FOV) of the MRI system in accordance with embodiments of the present invention as described below. The medical device may be an invasive device, a tracking coil or a surface coil (to which embodiments of the present invention are applicable and will be discussed in greater detail with reference to FIG. 4). As used herein, "adapted to", "configured" and the like refer to mechanical or structural connections between elements to allow the elements to cooperate to provide a described effect; these terms also refer to operation capabilities of electrical elements such as analog or digital computers or application specific devices (such as an application specific integrated circuit (ASIC)) that are programmed to perform a sequel to provide an output in response to given input signals.

The gradient wave forms produced by the pulse generator module 121 are applied to a gradient amplifier system 127 comprised of $G_x$, $G_y$ and $G_z$ amplifiers. Each gradient amplifier excites a corresponding gradient coil in the magnet system 103 to produce the magnetic field gradients used for position encoding acquired signals. A transceiver module 150 in the system control 122 produces pulses which are amplified by an RF amplifier 151 and coupled to an RF coil in the magnet assembly 103 by a transmit/receive switch 154. The resulting signals radiated by the excited nuclei in the patient may be sensed by the same RF coil and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the RF coil during the transmit mode and to connect the preamplifier 153 during the receive mode. In an embodiment of the present invention, a RF tracking coil (shown as 200 in FIG. 2) is mounted in a surface coil assembly 400 and RF tracking coil is connected directly to a second pre-amplifier 156. In an embodiment, the surface coil 400 is for superficial use and is placed by the attending physician or technologist and MR signals are detected by the tracking coil, are processed and used to locate the position of the surface coil. The imaging MR signals from the surface coil are coupled through pre-amplifier 153 to transceiver 150. As will be discussed in greater detail with reference to FIG. 4, an embodiment of the present invention provides a receive coil system comprising a surface coil and a plurality of tracking coils. The receive coil system detects MR signals in a similar manner and the signals are processed to locate the position of the surface coil. The amplified RF tracking coil signal is input to the transceiver module 150.

The MR signals picked up by a RF coil are digitized by the transceiver module 150 and transferred to a memory module 160 in the system control 122. When an array of k-space image data has been acquired in the memory module 160, an array processor 161 operates to Fourier transform the k-space data into an array of image data which is presented to the attending physician on a display 134. This image data may also be conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

FIG. 1 illustrates an open MRI system, which is designed to allow access by a physician. It is to be appreciated that the embodiments of the present invention described herein are also applicable to a conventional closed MRI system. Referring particularly to FIG. 1, when an intra-operative MR imaging procedure is conducted a patient is placed in the magnet system 103 and a region of interest in the patient is aligned near the system iso-center located between the two, spaced magnet rings 140 and 142. A physician standing between magnet rings 140 and 142 has unrestricted access to the region of interest in the patient.

The images to be produced by the MRI system are prescribed by selecting an appropriate MR imaging pulse sequence to be executed by the pulse generator 121. The location and orientation of the slices or 3D region to be imaged is also prescribed and is determined by the particular patient anatomy the physician wants to see during the procedure being performed. This location and orientation remains fixed until new commands are applied to the pulse generator 121.

In an embodiment of the present invention, a plurality of tracking coils are mounted on a surface coil that is to be placed on a subject within the MRI system. Tracking coil measurement acquisitions are interleaved with the acquisition of image data and MR tracking signals are detected by a tracking coil, are amplified by preamplifier 156 and coupled to transceiver module 150. These signals are then Fourier transformed by the array processor 161. The transformed MR tracking data is used by the locator sub-system 133 to produce a location measurement of the surface coil assembly.

Figure 3:
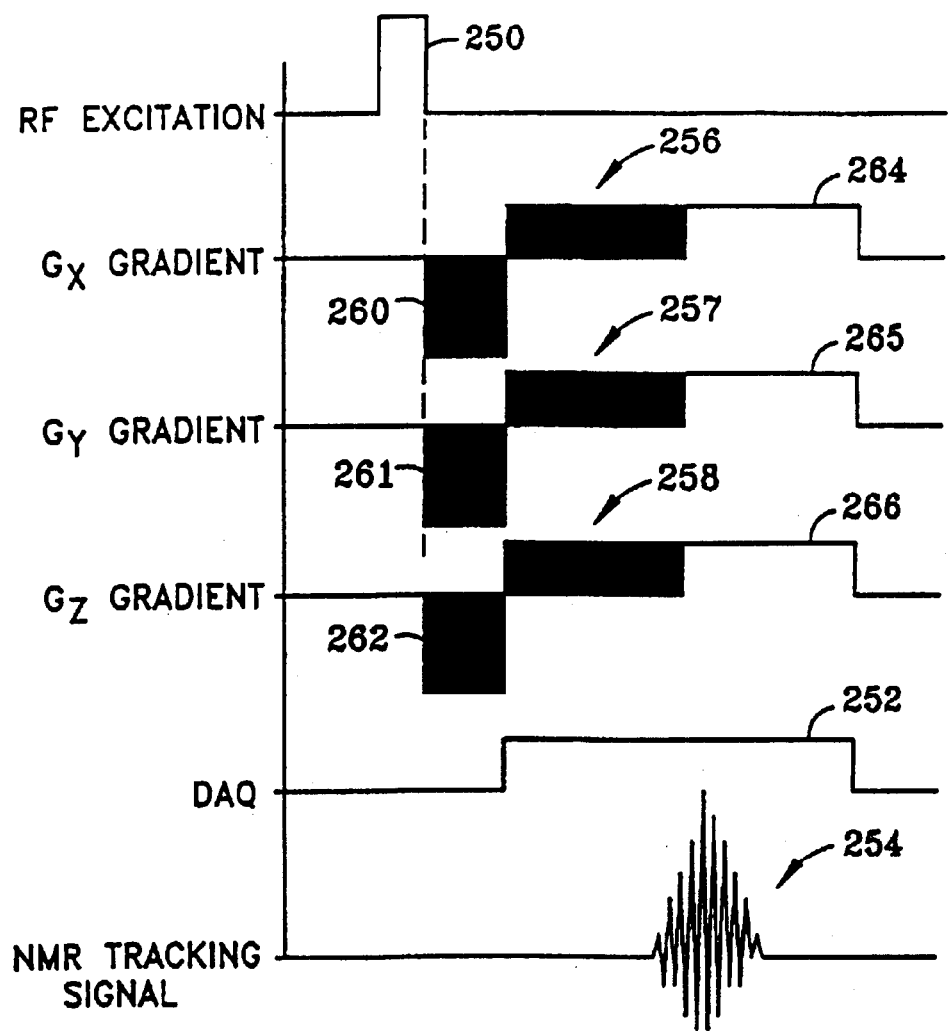
FIG. 3 is a graphic representation of an MR pulse sequence used by the MRI system of FIG. 1 to measure the position of the tracking coil of FIG. 2; and, FIG. 4 is a schematic diagram of a self-localizing receive coil system in accordance with an embodiment of the present invention.

In the present invention, the position of the tracking coil 200 relative to the gradient iso-center is measured using a position measurement MR pulse sequence shown in FIG. 3. This gradient recalled echo pulse sequence yields a signal that is essentially a Fourier transform of a projection of the coil location along the readout gradient direction. Assuming that the tracking coil 200 is small, its position $S_1$ is modeled by:

$$s_1 = \frac{\Delta \omega}{\gamma G_1} \quad (1)$$

where $\Delta \omega$ is the measurement angular frequency of the gradient echo signal relative to $\omega_0$, the Larmor frequency g, is the gyromagnetic ratio of the nuclear spins, and $G_1$ is the applied readout gradient. The three-dimensional position of each tracking coil 200 can be identified from three linearly independent gradient echoes.

Figure 2:
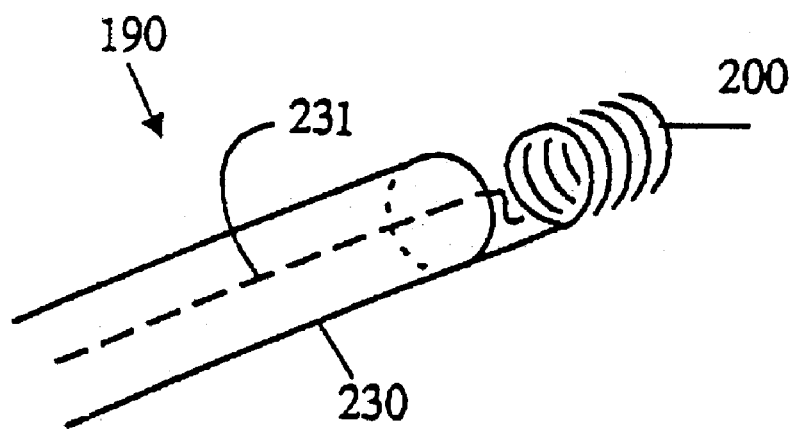
FIG. 2 is a schematic diagram of a tracking coil to which embodiments of the present invention are applicable.

The geometry of a typical tracking coil is shown in FIG. 2. This coil 200 has a solenoid geometry and a relatively well characterized sensitivity profile. MR signals detected by coil 200 are propagated to the MR system by co-axial conductors 230 and 231.

Referring particularly to FIG. 3, the tracking coil measurement pulse sequence includes a non-selective RF excitation pulse 250 that is applied to the MRI system whole body RF coil. It has a selected flip angle, typically chosen to be between 10 and 60 degrees and it produces transverse magnetization in spins located throughout the magnet bore. Three gradient wave forms 256, 257 and 258 are then applied to produce a gradient recalled MR echo signal. The T/R switch 154 is controlled during a data acquisition window 252 to receive an MR tracking signal 254 from the tracking coil 200. The three gradient wave forms 256, 257 and 258 are applied along the respective $G_x$, $G_y$ and $G_z$ gradient axes, and each includes a respective de-phase lobe 260, 261 and 262 and a respective readout lobe 264, 265 and 266. As indicated by the cross-hatching, the area of each de-phasing lobe 260–262 is equal to one-half the area of the respective readout lobes 264–266.

In the measurement pulse sequence of FIG. 3, all of the gradients waveforms 256–258 all have the same polarity, which is designated herein as "+". "−" indicates the polarity of gradient pulses 260–262 and 264–266 having a polarity opposite that of waveforms 256–258. This pulse sequence is performed a total of four times with the polarity of the $G_x$, $G_y$ and $G_z$ gradient pulses selectively reversed as set forth in Table 1.

TABLE 1

|  | $G_x$ | $G_y$ | $G_z$ |
| --- | --- | --- | --- |
| acquisition 1 | − | − | − |
| acquisition 2 | + | + | − |
| acquisition 3 | + | − | + |
| acquisition 4 | − | + | + |

As indicated above, the four MR tracking signals 254 are Fourier transformed to produce four corresponding projections $P_1$, $P_2$, $P_3$ and $P_4$. Together, these four projections form an MR tracking data set from which the x, y and z coordinates of the tracking coil position can be calculated in a manner well known to those skilled in the art.

Figure 4:
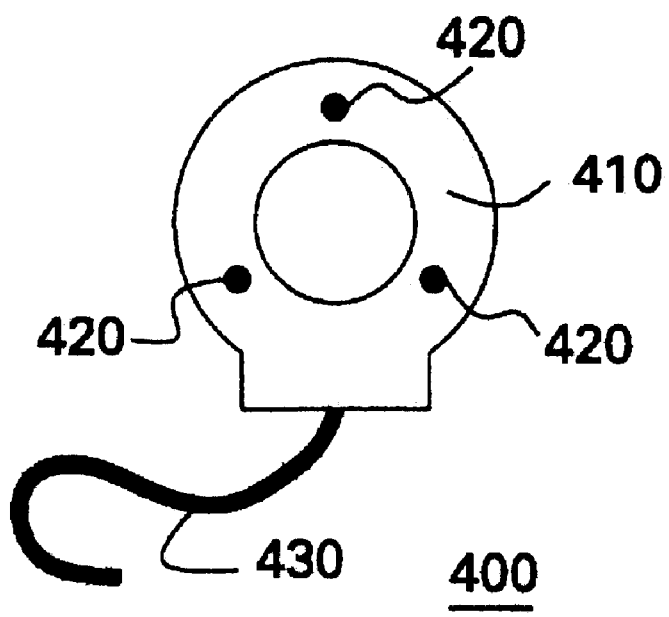

Referring to FIG. 4, there is shown an embodiment of a self-localizing receive coil system, or alternatively a self-localizing surface coil system, in accordance with embodiments of the present invention. As used herein, "surface coil" refers to a receive only RF imaging coil which, in general, is placed adjacent to the surface of the object being imaged. Also, as used herein, "self-localizing" refers to a system capability to identify location independent of operator intervention. In this embodiment, a surface coil is constructed to incorporate MR tracking locator coils. As shown in FIG. 4, a self-localizing receive coil system 400 for use with a MRI system comprises at least one surface coil assembly 410 for placement adjacent a region of interest to be imaged and a plurality of tracking devices 420 attached to surface coil assembly 410 for use in indicating location and orientation of the surface coil during imaging. Surface coil assembly 410 may be a conventional surface coil, a phase-darray surface coil or a flexible phased-array (FLAP) surface coil. Tracking devices 420 may be selected from any conventional tracking coils known to those skilled in the art. A cable 430 is provided to couple to the MRI system to communicate with locator sub-system 133 of FIG. 1 for tracking location of surface coil assembly. Additionally, cable 430 is adapted to carry MR signals corresponding to imaging information to the MRI system in the manner described with reference to FIG. 1. If the location and orientation of the surface coil are to be measured with MR tracking methods, at least three tracking devices arranged in a non-linear fashion are needed since each coil is capable of providing a location, but not an orientation. Desirably, tracking devices 420 are equally spaced on the surface of surface coil 410, and more particularly in an equilateral triangle configuration for optimal sensitivity and orientation measurements. It is appreciated that the quantity of tracking devices and placement about the surface coil are modifiable by one skilled in the art in order to measure orientation and location. The MR tracking devices 420 are each comprised of a simple solenoid coil wound around a small MR-active sample such as a small glass vial of water doped with $CuSO_4$ or a Gadolinium (Gd) relaxation agent.

In this embodiment, the MR tracking coils are used to identify the three-dimensional location and orientation of one or more surface coils. This localization can be performed very quickly (typically in less than 50 ms) and accurately (within 1 mm). For most applications it is sufficient to locate the surface coil immediately prior to image acquisition, although if necessary the coil localization can be performed as often as desired during scanning.

Once the surface coil location is known, it can be used in a number of ways. For example, if the intention is to acquire an intensity-corrected image, the location of surface coil can be used as an input to an intensity correction algorithm to reduce shading due to spatial variation in surface coil sensitivity. Such a correction can be based upon the Biot-Savat law or other similar theoretical models.

An alternative use for the self-localizing surface coil is in the context of high-speed imaging procedures such as SENSE and SMASH. These procedures take advantage of the spatial distribution of multiple receive coils to reduce the number of phase-encoding steps required to make an image. Phased-array coils used for these applications are typically constructed as a linear array of coils placed along the direction of the phase encoding gradient. In order to fully realize the benefit provided by the array, however, its location must be precisely known. To date, this has been done by placing the surface coil in a known location within the magnet, or by acquiring a reference image and estimating the coil location. Using self-localizing surface coils such as the one described above, the exact location of the surface coils could be determined without requiring the coils to be pre-positioned in a prescribed location or the acquisition of a reference scan.

A third use for the self-localizing coils is the elimination of aliasing artifacts such as the large FOV aliasing described above. In this embodiment, the self-localizing receive coil system is adapted to locate elements of the phased array coil contributing to aliasing artifacts. Self-localizing coils can do this by determining if one or more elements of a phased array coil are placed within a region of the magnet bore known to give large FOV aliasing problems. If a coil is found to be in this region, it can be turned off (or its data not used in the reconstruction). Thus, the final image does not suffer from an undesired aliasing artifact.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A self-localizing receive coil system for use with a Magnetic Resonance Imaging (MRI) system comprising:

at least one surface coil assembly for placement adjacent to a region of interest to be imaged; and, a plurality of tracking devices attached to the at least one surface coil assembly for use in indicating location and orientation of the surface coil assembly during imaging.

2. The system of claim 1 wherein the location of the surface coil assembly is used an in input to an intensity correction algorithm to reduce shading due to spatial variation in surface coil sensitivity.

3. The system of claim 1 wherein the surface coil assembly comprises a phase-darray surface coil.

4. The system of claim 3 wherein the self-localizing receive coil system is adapted to locate elements of the phased array coil contributing to aliasing artifacts.

5. The system of claim 1 wherein the self-localizing receive coil system is coupled to a locator sub-system within the MRI system.

6. The system of claim 3 wherein the MRI system employs simultaneous acquisition of spatial harmonics (SMASH) imaging procedures.

7. The system of claim 3 wherein the MRI system employs sensitivity encoding (SENSE) imaging procedures.

8. A method for locating at least one surface coil assembly placed adjacent to a region of interest to be imaged within a Magnetic Resonance Imaging (MRI) system comprising:

receiving magnetic resonance (MR) signals from a plurality of tracking devices attached to at least one surface coil assembly; and, processing the MR signals to indicate a location of the surface coil assembly during imaging.

9. The method of claim 8 wherein the location of the surface coil assembly is used an in input to an intensity correction algorithm to reduce shading due to spatial variation in surface coil sensitivity.

10. The method of claim 8 wherein the surface coil assembly comprises a phased-array surface coil.

11. The method of claim 10 wherein the MRI system employs simultaneous acquisition of spatial harmonics (SMASH) imaging procedures.

12. The method of claim 10 wherein the MRI system employs sensitivity encoding (SENSE) imaging procedures.

* * * * *